(12) United States Patent
Le Costaouec et al.

(10) Patent No.: US 9,725,803 B2
(45) Date of Patent: Aug. 8, 2017

(54) METHOD OF FORMING BORIDES IN CARBON COMPOSITES

(71) Applicant: GOODRICH CORPORATION, Charlotte, NC (US)

(72) Inventors: Jean-Francois Le Costaouec, Pueblo West, CO (US); Paul Perea, Pueblo West, CO (US)

(73) Assignee: Goodrich Corporation, Charlotte, NC (US)

( * ) Notice: Subject to any disclaimer, the term of this patent is extended or adjusted under 35 U.S.C. 154(b) by 135 days.

(21) Appl. No.: 14/790,996

(22) Filed: Jul. 2, 2015

(65) Prior Publication Data
US 2017/0002458 A1    Jan. 5, 2017

(51) Int. Cl.
C23C 16/38    (2006.01)
C23C 16/04    (2006.01)
(Continued)

(52) U.S. Cl.
CPC .......... *C23C 16/045* (2013.01); *C04B 35/624* (2013.01); *C04B 35/83* (2013.01); *C23C 16/26* (2013.01); *C23C 16/56* (2013.01); *F16D 69/028* (2013.01); *C04B 2235/3225* (2013.01); *C04B 2235/3232* (2013.01); *C04B 2235/3244* (2013.01); *C04B 2235/3804* (2013.01); *C04B 2235/3813* (2013.01); *C04B 2235/44* (2013.01); *C04B 2235/5436* (2013.01); *C04B 2235/5445* (2013.01); *C04B 2235/5454* (2013.01); *C04B 2235/614* (2013.01); *C04B 2235/616* (2013.01); *F16D 2200/0047* (2013.01)

(58) Field of Classification Search
CPC ....... C23C 16/38; C23C 16/40; C23C 16/045; B05D 3/02
See application file for complete search history.

(56) References Cited

U.S. PATENT DOCUMENTS

| 4,465,581 A | 8/1984 | Juel et al. |
| 5,759,688 A * | 6/1998 | Lee ...................... C04B 35/806 428/366 |

(Continued)

FOREIGN PATENT DOCUMENTS

| CN | 105016759 | 11/2015 |
| GB | 2151221 | 7/1985 |
| GB | 2444927 | 6/2008 |

OTHER PUBLICATIONS

Smeacetto, F., et al., "Oxidation protective multilayer coatings for carbon-carbon composites". Carbon 40 (2002) 583-587.*

(Continued)

*Primary Examiner* — Bret Chen
(74) *Attorney, Agent, or Firm* — Snell & Wilmer L.L.P.

(57) ABSTRACT

A method of treating a carbon-carbon structure is provided. The method includes the step of infiltrating the carbon-carbon structure with a ceramic preparation comprising an oxide compound and at least one of a boron compound or an oxide-boron compound to obtain a uniform distribution of the ceramic preparation within a porosity of the carbon-carbon structure. The carbon-carbon structure may be densified by chemical vapor infiltration (CVI) and heat treated to form borides. Heat treating the carbon-carbon may comprise a temperature ranging from 1000° C. to 1900° C.

20 Claims, 4 Drawing Sheets

(51) Int. Cl.
    *C04B 35/624* (2006.01)
    *C04B 35/83* (2006.01)
    *C23C 16/56* (2006.01)
    *F16D 69/02* (2006.01)
    *C23C 16/26* (2006.01)

(56) References Cited

U.S. PATENT DOCUMENTS

| | | | |
|---|---|---|---|
| 5,962,135 A | 10/1999 | Walker et al. | |
| 6,068,925 A * | 5/2000 | Wilson | C04B 35/83 428/408 |
| 6,277,440 B1 | 8/2001 | Reynolds | |
| 8,268,393 B2 | 9/2012 | Rollin et al. | |
| 8,337,799 B2 | 12/2012 | Bogicevic et al. | |
| 8,357,623 B2 | 1/2013 | Lillo et al. | |
| 8,858,846 B2 | 10/2014 | Simpson et al. | |
| 8,865,301 B2 | 10/2014 | Keller et al. | |
| 8,871,044 B2 | 10/2014 | Baud et al. | |
| 2005/0040004 A1 | 2/2005 | Kienzle et al. | |
| 2007/0128421 A1* | 6/2007 | Lee | C04B 35/521 428/292.1 |
| 2007/0178163 A1* | 8/2007 | Kodas | B01J 13/0043 424/489 |
| 2008/0311301 A1 | 12/2008 | Diss et al. | |
| 2010/0015332 A1* | 1/2010 | Rollin | C04B 35/83 427/228 |
| 2010/0202956 A1 | 8/2010 | Bogicevic | |
| 2011/0124253 A1 | 5/2011 | Shah et al. | |
| 2013/0337180 A1 | 12/2013 | Jacquemard et al. | |
| 2015/0376064 A1* | 12/2015 | Chung | C04B 33/326 501/100 |

OTHER PUBLICATIONS

Jimbou, R., et al., "New composite composed of boron carbide and carbon fiber with high thermal conductivity for first wall". Journal of Nuclear Materials 233-237 (1996) 781-786.*
R.Koc and D.B. Hodge, Production of TiB2 from a precursor containing carbon coated TiO2 and B4C, Journal of materials science letters 19 (2000), pp. 667-669, Kluwer Academic Publishers.
Extended European Search Report dated Dec. 2, 2016 in European Application No. 16177754.5.
U.S. Appl. No. 14/974,179, filed Dec. 18, 2015 and entitled Systems and Methods for Carbon-Carbon Materials Incorporating Yttrium and Zirconium Compounds.
Extended European Search Report dated Apr. 20, 2017 in European Application No. 16205090.0.
Gendre, et al., "Synthesis of zirconium oxycarbide (ZrCO) powders: Influence of stoichiometry on densification Kinetics during spark plasma sintering and on mechanical properties," Journal of the European Ceramic Society, ELsevier Science Publishers, Essex, GB, vol. 31, No. 13, May 25, 2011, pp. 2377-2385.
Restriction Requirement dated Jun. 5, 2017 in U.S. Appl. No. 14/974,179.

* cited by examiner

METHOD OF FORMING BORIDES IN CARBON COMPOSITES

FIELD

The present disclosure relates to carbon composites, and, more specifically, to a method of forming carbon composites.

BACKGROUND

Aircraft brakes may comprise carbon brake components. The brake rotors, stators, pressure plates, and end plates, for example, may be comprised of carbon fiber and pyrolytic composite materials. Brake rotors and stators comprising carbon fiber composite materials may exhibit varying wear characteristics resulting in part from the materials used in construction and heat treatments applied. Brake components with poor wear characteristics may have relatively short product lives and require more frequent maintenance or replacement.

SUMMARY

According to various embodiments, a method of treating a carbon-carbon structure may comprise infiltrating the carbon-carbon structure with a ceramic preparation comprising an oxide compound and at least one of a boron compound or an oxide-boron compound to obtain a uniform distribution of the ceramic preparation within a porosity of the carbon-carbon structure. The carbon-carbon structure may be densified by chemical vapor infiltration (CVI) and heat treated to form borides.

In various embodiments, boride particles may be formed within the carbon-carbon structure, wherein the boride particles comprise at least one of zirconium diboride, titanium diboride, or yttrium diboride. The carbon-carbon structure may be partially densified before the infiltrating the carbon-carbon structure with the ceramic preparation. The carbon-carbon structure may also be partially densified after infiltrating the carbon-carbon structure with the ceramic preparation. The method may further include preparing the ceramic preparation from at least one of a boron-oxide source or an oxide source and a boron source, wherein the ceramic preparation comprises at least one of a ceramic colloidal suspension or a sol gel. The oxide source comprises at least one of zirconia, yttria stabilized zirconia, $TiO_2$, or $Y_2O_3$, wherein the oxide source comprises at least one of submicron or nano particle size. The boron source may include at least one of boron powder, boron carbide powder, boron oxide powder, or boric acid. The boron powder may comprise a size less than 2 micrometers. A polyelectrolyte dispersant may be added to the ceramic preparation to coat the at least one of the oxide compound or the oxide-boron compound with a carbon film. A solid content of the ceramic preparation may be selected to leave an amount of a ceramic from 0.5% to 12% by weight of the carbon-carbon structure in response to completing the densification of the carbon-carbon structure. A carbon source comprising at least one of polyvinyl alcohol, polyacrylamide, hydro ethylcellulose, or an aqueous emulsion of polyester, epoxy, or phenolic may be added to the ceramic preparation. The heat treatment may include a temperature ranging from 1000° C. to 1900° C.

A method of treating a carbon-carbon structure may comprise forming the carbon-carbon structure, treating the carbon-carbon structure with heat at a first temperature ranging from 1000° C. to 2200° C., and infiltrating the carbon-carbon structure with a ceramic preparation. The ceramic preparation may comprise at least one of a ceramic colloidal suspension or a sol gel. The ceramic preparation may further include at least one of an oxide compound and a boron compound or an oxide-boron compound. The carbon-carbon structure may be densified by CVI, and the carbon-carbon structure may also be treated with heat at a second temperature ranging from 1000° C. to 1900° C.

In various embodiments, boride particles may be formed within the carbon-carbon structure. The boride particles may include at least one of zirconium diboride, titanium diboride, or yttrium diboride. The method may also include partially densifying the carbon-carbon structure before the infiltrating the carbon-carbon structure with the ceramic preparation. The carbon-carbon structure may also be partially densified after infiltrating the carbon-carbon structure with the ceramic preparation. The ceramic preparation may be prepared from at least one of a boron-oxide source or an oxide source and a boron source. The ceramic preparation may comprise at least one of a ceramic colloidal suspension or a sol gel. The oxide source may comprise at least one of zirconia, yttria stabilized zirconia, $TiO_2$, or $Y_2O_3$. The oxide source may comprise at least one of zirconia, yttria stabilized zirconia, $TiO_2$, or $Y_2O_3$. The oxide source may also comprise at least one of submicron or nano particle size. The method may further include adding a polyelectrolyte dispersant to the ceramic preparation to coat the at least one of the oxide compound or the oxide-boron compound with a carbon film. A solid content of the ceramic preparation may be selected to leave an amount of a ceramic from 0.5% to 12% by weight of the carbon-carbon structure in response to completing the densification of the carbon-carbon structure.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the exemplary embodiments of the disclosure, it should be understood that other embodiments may be realized and that logical changes and adaptations in design and construction may be made in accordance with this disclosure and the teachings herein. Thus, the detailed description herein is presented for purposes of illustration only and not limitation. The steps recited in any of the method or process descriptions may be executed in any order and are not necessarily limited to the order presented.

Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

The processes disclosed herein may include treatments for producing carbon fiber reinforced carbon material. Thus, as used herein the term "carbon-carbon structure" may be used to describe a preform, a carbon fiber reinforced carbon material at various stages of densification, and/or a carbon structure prior to densification and carbon reinforcement.

The processes disclosed herein further include infiltration of a ceramic preparation into a carbon structure to prepare the carbon-carbon structure. As used herein, ceramic preparation describes a ceramic colloidal suspension and/or a ceramic sol gel for infiltration into a carbon structure.

Figure 1:
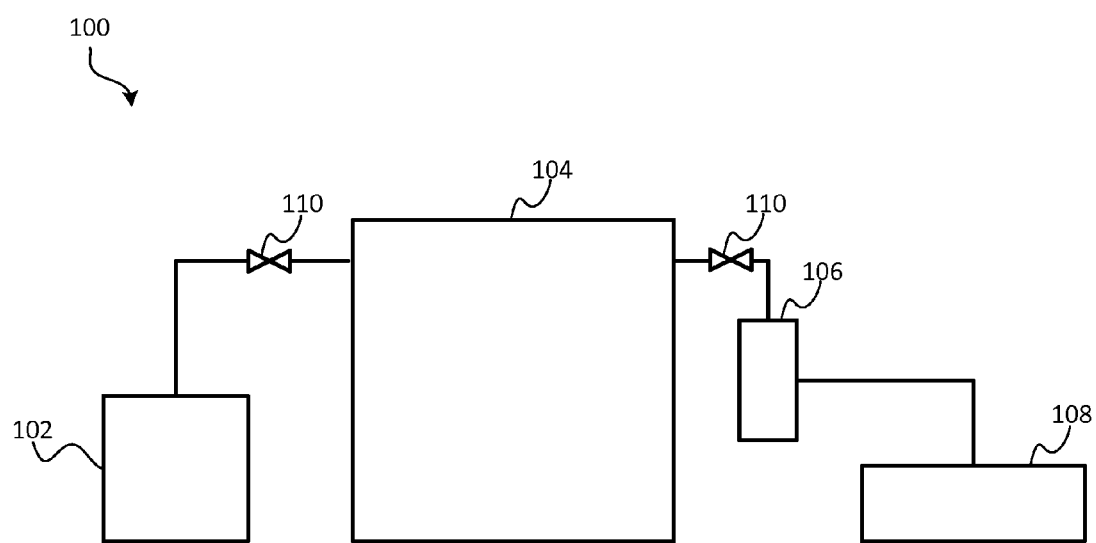
FIG. 1 illustrates an exemplary colloidal ceramic suspension infiltration system, in accordance with various embodiments.

With reference to FIG. 1, an exemplary colloidal ceramic suspension infiltration system 100 is shown, in accordance with various embodiments. System 100 includes a fluid reservoir 102 for storing and delivering the ceramic suspension into the vacuum chamber 104. Vacuum chamber 104 is equipped with a tank containing carbon fiber reinforced carbon material such as carbon preforms or partially densified carbon-carbon components. Vacuum pump 108 and trap 106 are used to first evacuate the porosity of the preforms or carbon composite parts and subsequently facilitate drawing the ceramic suspension into the tank containing the parts to be infiltrated. Following infiltration parts are removed and dried in a separate oven.

Figure 2:
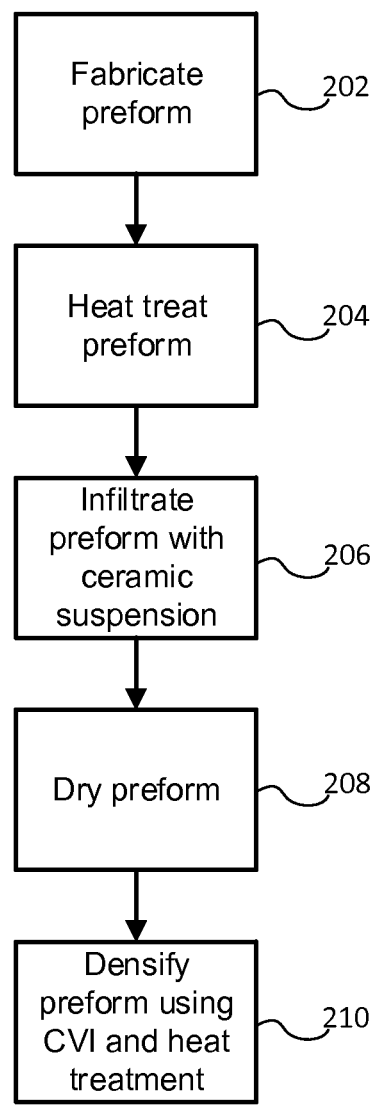
FIG. 2 illustrates a process for forming carbon components with a single application of ceramic material followed by multiple CVI densification steps, in accordance with various embodiments.

With reference to FIG. 2, a process 200 for treating a carbon fiber reinforced carbon structure is shown, in accordance with various embodiments. A fiber preform may be fabricated (Step 202). The fiber preform or carbon-carbon structure may comprise a porous structure. A porous structure may comprise any porous structure derived from a fibrous material such as carbon fibers and the like. The carbon fibers may be derived from polyacrylonitrile, rayon (synthetic fiber derived from cellulose), pitch, and the like. The starting fiber may be pre-oxidized PAN or fully carbonized commercial carbon fiber. The fibrous preform is preferably prepared using needling of individual textile layers. The individual brake preform may be fabricated using a net shape preforming technology or may be cut from a needled board. Alternatively preforms may be a 2D lay-up of woven, braided or knitted fabric. The fibrous material may be in the form of chopped carbon fibers molded to form a preform. Prior to the densification process, the fibrous material may be formed into a preform having any desired shape or form. For example, the porous structure may be in the form of a disk having any shape such as, for example, a polygon, a cylinder, a triangle, annular, square, rectangle, pentagon, hexagon, octagon, and the like. In addition, the porous structure may have an irregular form.

In various embodiments, the preform may be heat treated (Step 204) at temperatures between 1000° C. and 2200° C. Heat treatments described herein may vary in temperatures and durations.

In various embodiments, the preform may be infiltrated with a ceramic suspension that is one of a ceramic colloidal suspension or sol gel solution prepared with a selected ceramic content (Step 206). An aqueous colloidal suspension of very fine oxides and boron or oxide-boron compounds may be introduced in the carbon composite as described in detail below. The starting colloidal oxides may be nano-size suspensions. The boron compound powders may be as small as possible, less than 2 micron and preferably submicron size.

The uniform incorporation of a controlled amount of starting ultra-fine ceramic particles throughout the carbon composite may lead to the formation of ultra-fine boride particles (e.g., zirconium diboride, titanium diboride, and/or yttrium diboride) following subsequent heat treatments and further carbon densification cycles. The borides may be a single boride, a mixed borides or a combined boride. This may be accomplished by the preparation and introduction of a suspension containing either a single oxide like $ZrO_2$ or $TiO_2$ and a boron source; or mixed oxides like $ZrO_2$ and $TiO_2$ and a boron source; or a combined oxide like $ZrO_2/Y_2O_3$ and a boron source. Additives such as a wetting agent are made to the suspension to facilitate wetting of the preform or of the partially densified carbon-carbon. During subsequent heat treatments of the carbon composite under inert atmosphere at temperature greater than 1100° C., a boride or mixed borides may be formed through borothermal reduction of the oxide or oxides.

In various embodiments, the oxide compounds may be introduced using sol gel solution starting with one or several alkoxides such as zirconyl nitrate, zirconium butoxide, zirconium propoxide, titanium isopropoxide, titanium butoxide, tetrabuthyl titanate, yttrium nitrate. The boron source may be one of several compounds including boric acid.

It may be advantageous to provide additional source of carbon to the colloidal ceramic suspension or sol gel solution in order to control the grain size of the boride during the borothermal reaction. This is accomplished by adding a carbon compound to the starting suspension in the form of one or several water soluble polymers such as a polyvinyl alcohol (PVA), polyvinylpyrrolidone (PVP), polyvinyl acetate, poly (2-oxazoline), polyacrylamide (PAM), hydro ethylcellulose, polyethyleneimine (PEI), polyacrylate (PAA). An aqueous emulsion of polyester, epoxy or phenolic may be also used. These carbon sources exhibit various char yields and may be introduced in the form of one or more components. Prior to adding the additional carbon compound, the PH of the ceramic suspension may be adjusted. For example, In the case of PVA or hydro ethylcellulose addition, the PH of the ceramic suspension may be made basic.

In various embodiments, effectiveness of the carbon addition may be improved by pursuing the individual coating of the nano oxide particles alone or in combination with further carbon addition. Encapsulation of the nano particles with a thin polymeric layer during the preparation of the suspension may be accomplished by the addition of a polyelectrolyte dispersant or small amount of PVA into the ceramic suspension, which absorbs and coats the ceramic particles. The type and amount of polyelectrolyte may be chosen to provide a sufficient carbon char yield upon heat treatment in an inert atmosphere. In various embodiments, dispersants include ammonium polyacrylates, polyethyleneimine, and/or polyacrylamide. In response to subsequent processing, the absorbed layer of polymer may be pyrolyzed into a carbon film. In various embodiments, a larger amount of carbon may be achieved by introducing additional water soluble polymer in the colloidal ceramic suspension following the formation of an adsorbed polymer layer on the ceramic particles.

In various embodiments, the polymer may take different forms. The polymer may be a non-ionic polymer like PVA, PAM, hydro ethylcellulose, an aqueous emulsion of polyester, epoxy, phenolic or a combination of two or more of the polymers. The molecular weight and quantity of polymer may be chosen to maintain the overall viscosity of the colloidal suspension low in order to facilitate its infiltration within the carbon composite.

In various embodiments, the aqueous ceramic suspension may be prepared from dry or already suspended nano oxides and micron-sized boron compounds. For example, a micron size boron compound in powder or liquid form may be added to commercial aqueous nano suspensions of the selected oxide or oxides. A water soluble carbon source may be added to the ceramic suspension. A wetting agent may be added to facilitate wetting of the preform and or partially densified carbon-carbon. In various embodiments, oxide sources may include nano suspensions of zirconia, yttria stabilized zirconia, $TiO_2$, and/or $Y_2O_3$. In various embodiments, oxide sources may further include sol gel from one or several alkoxides such as zirconyl nitrate, zirconium butoxide, titanium isopropoxide, titanium butoxide, yttrium nitrate. Additionally, a Ti or Zr source may be a chelate such as aqueous titanium lactate, aqueous zirconyl chloride compound.

In various embodiments, possible boron sources may include boron, boron carbide powder, boron oxide powder, and/or boric acid. The aqueous ceramic suspension may be infiltrated either within the porosity of the preform or within the porosity of partially densified carbon-carbon. The infiltration may be conducted by immersing the preform or partially densified carbon-carbon in the aqueous ceramic suspension. Infiltration may also be conducted following evacuation of the pores using a vacuum chamber. Following introduction of the slurry within the part, the part may be dried to remove water. The targeted amount of dry ceramic compound ranges from 0.5% to 12% by weight of the finished carbon composite. The ceramic content of the aqueous ceramic suspension may be selected to leave ceramic compounds in the targeted range. The range may provide wear improvement benefit without negatively impacting the mechanical properties of the carbon composite.

Examples of starting material combinations to form various borides may include, for example, a preparation of zirconium diboride from $ZrO_2$ and boron. The borothermal reaction may proceed as:

$$ZrO_2 + 4B \rightarrow ZrB_2 + 2BO(g) \quad (1)$$

In various embodiments, a suspension may be prepared using diluted nano colloidal suspension of zirconia with a crystallite size of 13 nm (0.0005 mil) and boron powder with a specific surface area of 10 $m^2$/g. The ceramic suspension may contain a solid loading of 30% by weight. The amount of zirconia and boron may be 22.2% and 7.8% by weight, respectively.

In various embodiments, an exemplary preparation of zirconium diboride from ZrO2, boron and carbon may include reactions to proceed as:

$$ZrO_2 + 4B \rightarrow ZrB_2 + 2BO(g) \quad (2)$$

$$ZrO_2 + 2B + 2C \rightarrow ZrB_2 + 2CO(g) \quad (3)$$

In various embodiments, a suspension may also be prepared using diluted nano colloidal suspension of zirconia with a crystallite size of 13 nm (0.0005 mil), boron powder with a specific surface area of 10 $m^2$/g, and PVA. The PH of the colloidal suspension may be adjusted to a range from 9 to 11, and a wetting agent may be added. The inorganic solid loading of the ceramic suspension may be 7% by weight. The amount of zirconia, boron, and PVA may be 5.2%, 1.8%, and 6% by weight, respectively.

In various embodiments, an example preparation of zirconium diboride from ZrO2, boron carbide, and carbon may proceed as:

$$2ZrO_2 + B_4C + 3C \rightarrow 2ZrB_2 + 4CO(g) \quad (4)$$

In various embodiments, a suspension may further be prepared using diluted nano colloidal suspension of zirconia with a crystallite size of 13 nm (0.0005 mil), boron carbide powder with a specific surface area of 22 $m^2$/g, and polyacrylamide. The PH of the colloidal suspension may be adjusted to a range from 9 to 11, and a wetting agent may be added. The ceramic suspension may contain an inorganic solid loading of 8% by weight. The amount of zirconia, boron carbide, and PMA may be 5.8%, 1.3%, and 8% by weight, respectively.

In various embodiments, a suspension may be prepared using diluted nano colloidal suspension of zirconia with a crystallite size of 13 nm (0.0005 mil), boron carbide powder with a specific surface area of 22 $m^2$/g, PVA, and hydro ethylcellulose. The ceramic suspension may contain an inorganic solid loading of 12% by weight. The amount of zirconia, boron carbide, PVA, and hydro ethylcellulose may be 8.8%, 2%, 2%, and 4%, respectively. The PH of the colloidal suspension may be adjusted to a range from 9 to 11, and ammonium polyacrylates polyelectrolyte at a level of 2% of the total amount of inorganic material may be first added into the colloidal suspension. A wetting agent may be added to the final suspension.

In various embodiments, an example preparation of titanium diboride from TiO2, boron carbide, and carbon may proceed as $$2TiO_2 + B_4C + 3C \rightarrow 2TiB_2 + 4CO(g) \quad (5)$$

In various embodiments, a suspension may be prepared using diluted nano colloidal suspension of titania with a crystallite size of 100 nm (0.0039 mil), boron carbide powder with a specific surface area of 22 $m^2$/g, and polyacrylamide. The PH of the colloidal suspension may be adjusted to a range from 9 to 11, and a wetting agent may be added. The ceramic suspension may contain an inorganic solid loading of 10% by weight. The amount of titania, boron carbide, and PMA may be 6.4%, 2.2%, and 7%, respectively.

In various embodiments, a suspension may be prepared using diluted nano colloidal suspension of titania with a crystallite size of 100 nm (0.0039 mil), boron carbide powder with a specific surface area of 22 $m^2$/g, PVA, and hydro ethylcellulose. The PH of the colloidal suspension may be adjusted to a range from 9 to 11, and a wetting agent may be added. The ceramic suspension may contain an inorganic solid loading of 15% by weight. The amount of titania, boron carbide, PMA, and hydro ethylcellulose may be 9.5%, 3.3%, 3%, and 3%, respectively.

In various embodiments, an exemplary preparation of zirconium yttrium diboride may result from combined $Y_2O_3$ stabilized zirconia, boron carbide, and carbon. A suspension may be prepared using diluted nano colloidal suspension of Yttria stabilized zirconia with crystallite size of 10 nm (0.00039 mil), boron carbide powder with a specific surface area of 22 $m^2$/g, and PVA. The amount of yttria may be 16% by weight of the yttria/zirconia powder, though other ratios of yttria are commercially available and may be used. The PH of the colloidal suspension may be adjusted to a range from 9 to 11, and a wetting agent may be added. The ceramic suspension may contain an inorganic solid loading of 12% by weight. The amount of yttria stabilized zirconia, boron carbide, and PVA may be 8.8%, 2.0%, and 7%, respectively.

In various embodiments, an example preparation of mixed zirconium titanium diboride from mixed zirconia and titania, boron carbide, and carbon may be used. A suspension may be prepared using diluted nano colloidal suspension of zirconia with a crystallite size of 13 nm (0.0005 mil) and of titania with a crystallite size 100 nm (0.0039 mil), boron carbide powder with a specific surface area of 22 $m^2$/g, and PVA. The ceramic suspension may contain an inorganic solid loading of 12% by weight. The amount of zirconia, titania, boron carbide, and PVA may be 4.4%, 3.8%, 2.3%, and 2%, respectively. Ammonium polyacrylates polyelectrolyte at a level of 2.5% of the total amount of inorganic material may be first added into the colloidal suspension. A wetting agent may be added to the final suspension.

Figure 4:
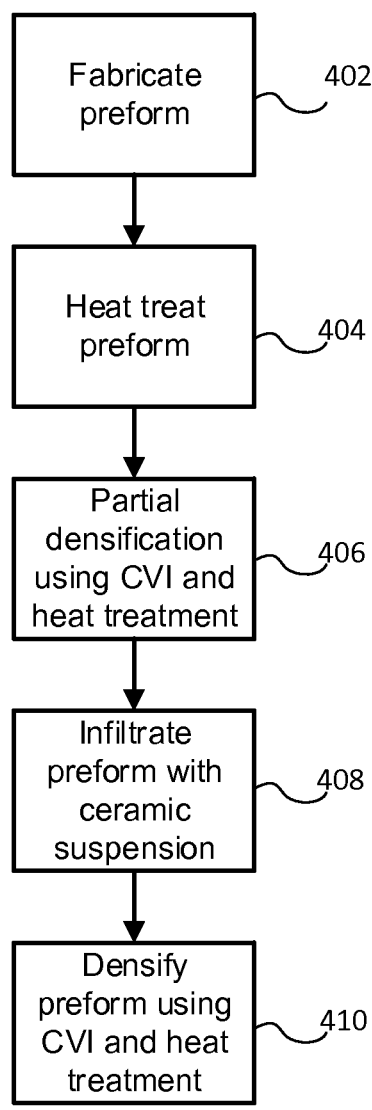
FIG. 4 illustrates a process for forming carbon components with an application of ceramic material following a partial CVI densification, in accordance with various embodiments.

In various embodiments, the total amount of inorganic material may be introduced at one stage of the carbon composite fabrication, example at the preform level or after a partial pyrolytic carbon densification as shown in FIGS. 2 and 4. The total amount of ceramic compound may also be introduced at several stages of the carbon composite fabrication as illustrated in FIG. 2. For example, the ceramic may be partially introduced into the preform before and after partial CVI pyrolytic infiltration.

Following drying of the ceramic suspension incorporated within the carbon composite, the preform or partially densified carbon-carbon may be heat treated to a suitable temperature in an inert environment so as to transform the added polymer into amorphous carbon. This step may be conducted in a separate furnace or during the ramp up to temperature of a CVI pyrolytic carbon densification cycle. Following each addition of pyrolytic carbon to the carbon composite, the preform may be heat treated to fully or partially complete the borothermal reaction. In various embodiments, heat treatment may be conducted only after specific CVI densification cycles, for example, following the final CVI densification step.

After ceramic suspension infiltration, the preform may be dried (Step 208). The preform may further be densified using multiple CVI cycles (Step 210). Each densification process may include a heat treatment. The carbon-carbon may be subjected to a heat treatment between 1000° C. and 1900° C., for example.

Figure 3:
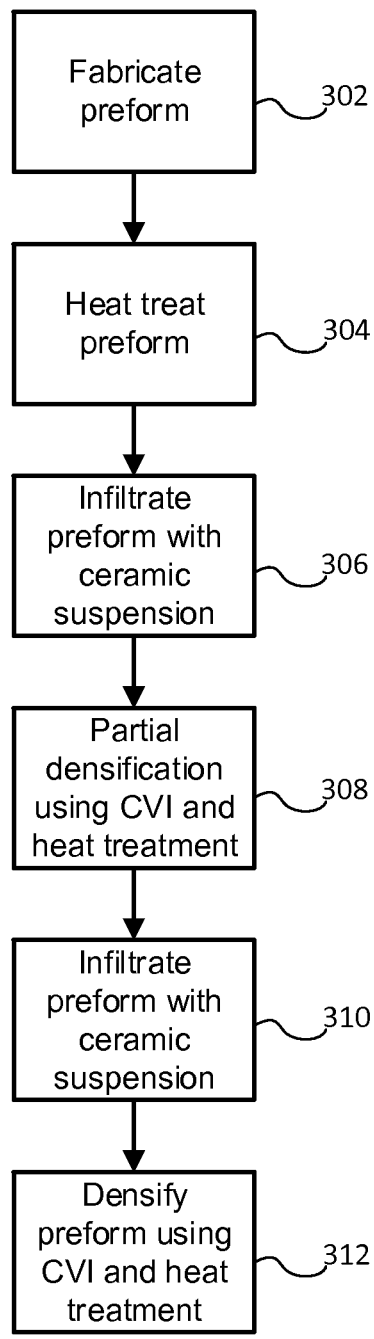
FIG. 3 illustrates a process for forming carbon components by applying ceramic material multiple times, in accordance with various embodiments.

With reference to FIG. 3, a process 300 for treating a preform and/or partially densified carbon-carbon is shown, in accordance with various embodiments. Process 300 is similar to process 200 of FIG. 2 in that process 300 may begin by fabricating a preform (Step 302) and heat treating the preform (Step 304). Process 300 may also end with densifying the preform using CVI (Step 312) in a manner similar to that of process 200 of FIG. 2. The steps of infiltrating the preform with a ceramic suspension (Step 306 and Step 310) may be followed by a drying step similar to step 208 of FIG. 2, and may also be similar to the infiltration of Step 206 of FIG. 2 but applied at different times. The first infiltration step (Step 306) may be applied after the fiber preform is fabricated and heat treated but before a partial CVI densification and heat treatment step (Step 308). The second infiltration step (Step 310) may be applied after partial densification using CVI (Step 308). After the second infiltration step (Step 308), the partially densified carbon-carbon may be densified using CVI (Step 312). Thus, ceramic suspension infiltration may be applied on two or more separate occasions in process 300. Further partial CVI and/or heat treatment steps may separate the various ceramic suspension infiltration steps.

With reference to FIG. 4, a process 400 for treating a preform is shown, in accordance with various embodiments. Process 400 is similar to process 200 of FIG. 2 in that process 400 may begin with fabricating a preform (Step 402) and heat treating the preform (Step 404), and end with densifying the preform using CVI and heat treating the carbon composite (Step 410). Infiltrating the preform with ceramic suspension (Step 408) may be similar to the infiltration step of process 200 of FIG. 2 (i.e., Step 206 of FIG. 2) but applied at different times. Infiltrating the preform with a ceramic suspension (Step 410) may follow after the preform is partially densified using CVI (Step 406) and heat treated following the CVI.

Benefits and other advantages have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, and any elements that may cause any benefit or advantage to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of treating a carbon-carbon structure, comprising:
    infiltrating the carbon-carbon structure with a ceramic preparation to obtain a uniform distribution of the ceramic preparation within a porosity of the carbon-carbon structure, wherein the ceramic preparation comprises an oxide compound, wherein the ceramic preparation comprises at least one of a boron compound or an oxide-boron compound, wherein the at least one of the boron compound or the oxide-boron compound comprises nano particles coated with a polymeric layer;
    densifying the carbon-carbon structure by chemical vapor infiltration (CVI); and
    heat treating the carbon-carbon structure to form borides.

2. The method of claim 1, further comprising forming boride particles within the carbon-carbon structure, wherein the boride particles comprise at least one of zirconium diboride, titanium diboride, or yttrium diboride.

3. The method of claim 1, further comprising partially densifying the carbon-carbon structure before the infiltrating the carbon-carbon structure with the ceramic preparation.

4. The method of claim 1, further comprising partially densifying the carbon-carbon structure after infiltrating the carbon-carbon structure with the ceramic preparation.

5. The method of claim 1, further comprising preparing the ceramic preparation from at least one of a boron-oxide source or an oxide source and a boron source, wherein the ceramic preparation comprises at least one of a ceramic colloidal suspension or a sol gel.

6. The method of claim 5, wherein the oxide source comprises at least one of zirconia, yttria stabilized zirconia, $TiO_2$, or $Y_2O_3$, wherein the oxide source comprises at least one of submicron or nano particle size.

7. The method of claim 5, wherein the boron source comprises at least one of boron powder, boron carbide powder, boron oxide powder, or boric acid, wherein the boron powder comprises a size less than 2 micrometers.

8. The method of claim 1, further comprising adding a polyelectrolyte dispersant to the ceramic preparation to coat the at least one of the oxide compound or the oxide-boron compound with a carbon film.

9. The method of claim 1, further including selecting a solid content of the ceramic preparation to leave an amount of a ceramic from 0.5% to 12% by weight of the carbon-carbon structure in response to completing a densification of the carbon-carbon structure.

10. The method of claim 1, further comprising adding a carbon source to the ceramic preparation, wherein the carbon source comprises at least one of polyvinyl alcohol, polyacrylamide, hydro ethylcellulose, or an aqueous emulsion of polyester, epoxy, or phenolic.

11. The method of claim 1, wherein the heat treating the carbon-carbon structure comprises a temperature ranging from 1000° C. to 1900° C.

12. A method of treating a carbon-carbon structure, comprising:
    forming the carbon-carbon structure;
    treating the carbon-carbon structure with heat at a first temperature ranging from 1000° C. to 2200° C.;
    infiltrating the carbon-carbon structure with a ceramic preparation comprising at least one of a ceramic colloidal suspension or a sol gel, the ceramic preparation comprising at least one of a boride compound or an oxide compound, wherein the ceramic preparation comprises nano particles coated with a polymeric layer;
    densifying the carbon-carbon structure by chemical vapor infiltration (CVI); and
    treating the carbon-carbon structure with heat at a second temperature ranging from 1000° C. to 1900° C.

13. The method of claim 12, further comprising forming boride particles within the carbon-carbon structure, wherein the boride particles comprise at least one of zirconium diboride, titanium diboride, or yttrium diboride.

14. The method of claim 12, further comprising partially densifying the carbon-carbon structure before the infiltrating the carbon-carbon structure with the ceramic preparation.

15. The method of claim 12, further comprising partially densifying the carbon-carbon structure after infiltrating the carbon-carbon structure with the ceramic preparation.

16. The method of claim 12, further comprising preparing the ceramic preparation from at least one of a boron-oxide source or an oxide source and a boron source.

17. The method of claim 16, wherein the oxide source comprises at least one of zirconia, yttria stabilized zirconia, $TiO_2$, or $Y_2O_3$.

18. The method of claim 16, wherein the oxide source comprises at least one of zirconia, yttria stabilized zirconia, $TiO_2$, or $Y_2O_3$, wherein the oxide source comprises at least one of submicron or nano particle size.

19. The method of claim 12, further comprising adding a polyelectrolyte dispersant to the ceramic preparation to coat the at least one of the oxide compound or the oxide-boron compound with a carbon film.

20. The method of claim 12, further including selecting a solid content of the ceramic preparation to leave an amount of a ceramic from 0.5% to 12% by weight of the carbon-carbon structure in response to completing a densification of the carbon-carbon structure.

* * * * *